United States Patent [19]
Yamazaki et al.

[11] Patent Number: 5,866,444
[45] Date of Patent: Feb. 2, 1999

[54] INTEGRATED CIRCUIT AND METHOD OF FABRICATING THE SAME

[75] Inventors: Shunpei Yamazaki, Tokyo; Jun Koyama, Kanagawa; Toshimitsu Konuma, Kanagawa; Satoshi Teramoto, Kanagawa, all of Japan

[73] Assignee: Semiconductor Energy Laboratory Co., Kanagawa-ken, Japan

[21] Appl. No.: 617,414

[22] Filed: Mar. 18, 1996

[30] Foreign Application Priority Data

Mar. 21, 1995 [JP] Japan .................................. 7-088788
Apr. 14, 1995 [JP] Japan .................................. 7-113842

[51] Int. Cl.⁶ .................................................. H01L 21/28
[52] U.S. Cl. ......................... 438/151; 438/635; 438/639; 438/768
[58] Field of Search ........................ 437/40 TFT, 40 TFI, 437/41 TFT, 41 TFI, 194, 236, 237, 983; 257/72, 401, 775; 349/46, 47, 139, 142, 143; 205/124; 438/151, 635, 639, 666, 668, 768

[56] References Cited

U.S. PATENT DOCUMENTS

| | | | |
|---|---|---|---|
| 5,202,274 | 4/1993 | Bae et al. | 437/236 |
| 5,403,762 | 4/1995 | Takemura | 437/41 |
| 5,576,225 | 11/1996 | Zhang et al. | 437/21 |

FOREIGN PATENT DOCUMENTS

| | | |
|---|---|---|
| 63-301547 | 12/1988 | Japan . |
| 2-216129 | 8/1990 | Japan . |
| 8-62630 | 3/1996 | Japan . |

OTHER PUBLICATIONS

S. Wolf & R.N. Tauber, "Silicon Processing for the VLSI Era" vol. 1, pp. 221–223, 1986.
S. Wolf, "Silicon Processing for the VLSI Era" vol. II, pp. 268–269, 1990.

*Primary Examiner*—Charles Bowers
*Assistant Examiner*—Matha W Whipple
*Attorney, Agent, or Firm*—Fish & Richardson P.C.

[57] ABSTRACT

An integrated circuit using conductive interconnects made of aluminum or a material consisting chiefly of aluminum. Defects due to hillocks and whiskers are prevented. The integrated circuit is composed of TFTs. Gate interconnects are made of aluminum. Before a metallization film for forming the gate interconnects is patterned, slits are formed in locations where crosstalks and shorts are likely to occur by generation of hillocks and whiskers. The surfaces inside the slits are anodized. The conductive interconnects are formed, using the locations provided with the slits. In this way, during the anodization, unwanted stress is prevented. Furthermore, it is unlikely that a required electric current cannot be supplied for the anodization because of excessive complexity of the interconnection pattern.

23 Claims, 11 Drawing Sheets

INTEGRATED CIRCUIT AND METHOD OF FABRICATING THE SAME

FIELD OF THE INVENTION

The present invention relates to an integrated circuit using metal electrodes and metal interconnects. The invention also relates to a method of fabricating such an integrated circuit.

BACKGROUND OF THE INVENTION

As design rules decrease, it becomes more difficult to form stripes of metallization. Also, as device sizes become smaller, the resistance of each conductive interconnect itself can no longer be neglected. Therefore, it has been required that each conductive interconnect be made of a material having a minimum resistance available. Examples of the metallization material having small resistance include aluminum and materials consisting mainly of aluminum.

However, where stripes of metallization are made of a metallic material consisting principally of aluminum, the aluminum component grows abnormally, thus deforming the stripes of metallization with undesired convex surface protrusions. These are usually called hillocks and whiskers. Furthermore, undesired shapes are created.

These hillocks and whiskers are produced during heating for formation of films, during heating for ashing of resist (removal of resist by an oxygen plasma), and during heating induced by laser irradiation used for annealing.

The hillocks are produced by abnormal growth of aluminum. In particular, when aluminum components grow abnormally locally, the locally growing portions collide against each other, thus resulting in convex protrusions. The whiskers are needle-like or rectangular protrusions produced by abnormal growth of aluminum. The causes of the hillocks and whiskers are not understood exactly, but it is considered that some impurities in the aluminum or nonuniformity of the crystalline structure of the aluminum induces them.

These hillocks and whiskers grow over lengths of several micrometers and, therefore, where an integrated circuit comprising a number of conductive interconnects and components spaced only several micrometers from each other is fabricated, the hillocks and whiskers are great impediments.

One method of suppressing the hillocks and whiskers is to add a trace amount of a rare-earth element, silicon, or other element to the aluminum. However, where the element is heated to a temperature exceeding about 400° C., hillocks and whiskers are again produced.

Moreover, there is an increasing demand for formation of aluminum interconnects such as gate interconnects in the early stage of the fabrication process. In this case, the problems of the hillocks and whiskers cause more serious results, because the aluminum interconnects are unavoidably frequently subjected to heating during heating steps of the process or during other steps inevitably involving heating such as ion implantation.

The hillocks and whiskers are problematic because the distance between vertically or horizontally spaced conductive interconnects might be shorted by them. As design rules and interconnect pitch diminish, this problem becomes more conspicuous. Especially, where the interconnect pitch is reduced below 2 $\mu$m, shorting of adjacent conductive interconnects and shorting of vertically adjacent conductive interconnects due to lateral hillocks and whiskers pose problems.

In locations where conductive interconnects existing in different layers intersect each other, it is necessary to form an interlayer dielectric film (made of a silicon oxide film, for example) on the lower layer of metallization and to form the upper layer of metallization on the interlayer dielectric film. In this case, if the step coverage of the interlayer dielectric film is not good, then the upper layer of metallization will break at the step or local resistance increases will be induced. If a metallization layer made of aluminum or a material consisting mainly of aluminum is formed, followed by formation of an interlayer dielectric film, and if the second layer of metallization is subsequently formed, then the step coverage of the interlayer dielectric film is deteriorated by the hillocks and whiskers inevitably produced as mentioned above. As a result, the second layer of metallization formed on the interlayer dielectric film breaks at the step or present other problems.

Another technique for solving this problem has been proposed. Specifically, conductive interconnects are formed from a metallic material capable of being anodized such as aluminum. Using the interconnects as anodes, an anodization process is carried out. An anodic oxide film is formed on the exposed surfaces of the conductive interconnects. For example, where the conductive interconnects are made of aluminum or a material consisting principally of aluminum, an oxide film made of aluminum or a material consisting mainly of aluminum is formed on the top and side surfaces of the interconnects. This strengthens the top and side surfaces of the interconnects, thus suppressing the generation of the hillocks and whiskers.

However, in order to effect the anodization, a pattern different from the actual circuit interconnection pattern must be formed. After the anodization, the required conductive pattern must be created by etching techniques to make it possible to supply electrical current to every conductive interconnect. This means an increase in the number of manufacturing steps and hence not desirable. Especially, the former patterning step is performed after formation of the circuit conductive interconnects and so unwanted etching tends to occur. Consequently, this is not desirable from a view point of manufacturing yield.

In addition, as design rules and linewidths decrease, stress induced during anodization often causes conductive interconnects to be deformed and break. The problem especially becomes more conspicuous where the geometry of the conductive interconnects becomes more complex.

Further, as design rules and linewidths decrease, a voltage drop caused during anodization by the conductive interconnect resistance produces an effect. That is, as the voltage drops, the thickness of the formed anodic oxide film is varied.

This problem may be solved by increasing the cross-sectional area of each conductive interconnect to more than needed so as to alleviate the voltage drop during the anodization due to the conductive interconnect resistance. However, increasing the cross-sectional area of the interconnects hinders increasing the circuit integration density.

Anodic oxidation techniques can prevent hillocks and whiskers where conductive interconnects or electrodes are formed from aluminum or a material consisting mainly of aluminum. However, the aforementioned various problems take place. Besides aluminum, conductive materials capable of being anodized such as tantalum are known. The above-described problems again occur where these materials are used.

SUMMARY OF THE INVENTION

It is an object of the present invention to provide a technique for suppressing generation of hillocks and whiskers by the use of anodization techniques where conductive interconnects or electrodes are formed from aluminum or a material consisting principally of aluminum.

It is another object of the invention to provide a technique for preventing the foregoing problems which would have been heretofore induced during anodization when conductive interconnects are formed from any material capable of being anodized.

It is a more specific object of the invention to provide a technique for preventing the integration density of an integrated circuit from deteriorating even if anodization techniques are utilized.

A method according to the present invention comprises the steps of: (1) preparing a metallic material consisting mainly of aluminum; (2) forming a metallization layer from the metallic material on a substrate; (3) etching the metallization layer, using a first mask, to form slits; (4) anodizing the metallization layer to form anodic oxide barrier metallization on the surface of the metallization layer and on side surfaces of the slits; (5) etching the barrier metallization into a conductor pattern, using a second mask.

The slits are mainly located in portions where adjacent conductive interconnects are very closely spaced from each other, typically where the interconnect pitch is less than 2 μm, or where an interconnect in the top layer of metallization intersects. In this case, the slit width is synonymous with the interconnect pitch. The slits are made to have the simplest possible shape such as a rectangle. This minimizes the deformation due to stress during anodization in step (4) above.

Substantially no metallization is left inside the slits except for unintentional etch residues, because it is necessary that the side surfaces of the metallization at both ends of each slit be anodized. Where the metallization layer is made of aluminum, 0.1–0.5% by weight of scandium, yttrium, or zirconium may be added.

Where the invention is applied to a monolithic active matrix circuit (a semiconductor integrated circuit consisting of an active matrix circuit and a driver circuit for driving the active matrix circuit; both semiconductor integrated circuit and driver circuit are fabricated by the same process), the following process steps can be adopted:

(1) A layer of metallization capable of being anodized is formed on a substrate;

(2) The layer of metallization is etched, using a first mask, to form slits only in regions for the driver circuit;

(3) The layer of metallization is anodized to form anodic oxide barrier metallization on the surface of the layer of metallization and on the side surfaces of the slits;

(4) The layer of metallization is etched, using a second mask, to form interconnection patterns for the driver circuit and for the active matrix circuit; and (5) Only the conductive interconnects for the active matrix circuit are anodized.

As a result, as disclosed in Japanese Patent Laid-Open Nos. 114724/1993 and 267667/1993, anodic oxide is formed on the side surfaces of gate electrodes, and thin-film transistors (TFTS) of the offset structure can be selectively formed, using the anodic oxide, only in the active matrix circuit. Furthermore, TFTs forming a peripheral circuit can be selectively made to have the offset structure. This will be described in further detail in Example 1.

Another method according to the invention comprises the steps of: forming a film from a material capable of being anodized; forming slits in desired regions of the film; performing anodization within an electrolytic solution, using the film as an anode; and patterning the film to form a desired interconnection pattern.

In the above-described method, examples of the material capable of being anodized include aluminum and materials consisting mainly of aluminum. Another example may be tantalum. However, because of a low resistance value, it is desired to use aluminum or a material consisting mainly of aluminum as the material. In the latter case, a trace amount of impurity is added to aluminum to control the physical properties.

Moreover, in the above-described method, it is necessary that regions where conductive interconnects are laid at a high density be selected as the desired regions subjected to anodization.

A specific circuit pattern for a thin-film integrated circuit, obtained by the method described above, is shown in FIG. 9(B), which is a top view of an actual interconnection pattern of the equivalent circuit of FIG. 7(B). In FIG. 9(B), indicated by 303 and 301 are conductive interconnects made of a material consisting principally of aluminum. These interconnects form gate interconnects and gate electrodes (acting also as parts of the gate interconnects) for TFTs formed on a glass substrate.

An anodic oxide film 302 is formed in sites where hillocks and whiskers should be precluded. Since the regions on which the anodic oxide film 302 is formed are free from hillocks and whiskers, neither crosstalk nor short is produced between adjacent conductive interconnects. Those regions where the conductive interconnects are laid especially at a high density are selected as the regions on which the anodic oxide film is formed.

A further method according to the invention comprises the steps of: forming a film from a material capable of being anodized; forming slits in desired regions of the film; performing anodization within an electrolytic solution, using the film as an anode; patterning the film to form a desired interconnection pattern; and subsequently heating the laminate.

In the above-described method, desired conductive interconnects are anodized provided that the laminate is intentionally or unintentionally heated after the formation of the interconnection pattern. As a consequence, hillocks and whiskers are prevented in these portions.

A still other method according to the invention comprises the steps of: forming a film of metallization from aluminum or from a material consisting mainly of aluminum; forming slits in desired regions of the film of metallization; performing anodization within an electrolytic solution, using the film of metallization as an anode; patterning the film of metallization to form a desired interconnection pattern; and subsequently heating the laminate while permitting formation of hillocks and/or whiskers on surfaces of regions not anodized.

In the above-described method, since the laminate is heated after the anodic oxide film is formed in the desired regions, even if hillocks or whiskers are produced, the anodic oxide film created by the previous anodization can suppress generation of defects in regions, which would otherwise cause difficulties. More specifically, the regions where generation of hillocks and whiskers is permitted are not anodized. Slits are formed and anodization is carried out only in regions where anodization is necessary. Hence, the anodic oxide film is formed only on the desired side surfaces of the formed conductive interconnects. This can circumvent the difficulties which would otherwise be induced during anodization. That is, generation of unwanted stress accompanying anodization and nonuniformities of the anodic film thickness due to a voltage drop can be avoided An integrated circuit according to the invention comprises: an interconnection pattern made of a material capable of being anodized; and an anodic oxide film formed on parts of the interconnection pattern. Hillocks and/or whiskers are formed on regions not coated with the anodic oxide film.

The fundamental concept of the present invention is described by referring to FIGS. 1(A)–1(G). First, as shown in FIG. 1(A), a layer of metallization 2 made of a metal capable of being anodized is formed on a substrate 1. Using a mask, the layer of metallization 2 is etched to form slits 3 (only one is shown).

Then, an anodization step is carried out to form an anodic oxide film 4 acting as a barrier on the surface of the layer of metallization 2. At this time, an anodic oxide film 5 is also formed on the side surfaces of the layer of metallization which face the slits 3. In the present invention, complex conductive interconnects are not oxidized and so stress occurring during the anodization hardly deforms the layer of metallization or the slits (FIG. 1(B)).

Then, using a second mask, the anodic oxide film and the layer of metallization are etched to form conductive interconnects 7 and 8. The dotted line 6 shows the cutout formed in the layer of metallization by the etching (FIG. 1(C)).

FIG. 1(D) is a top view of the first and second masks. The dotted line 6 corresponds to the dotted line in FIG. 1(C). The dot-and-dash line 9 indicates the first mask, while the solid line 10 indicates the second mask (FIG. 1(D)).

FIG. 1(E) is a top view of the structure shown in FIG. 1(C). The anodic oxide film 5 is formed even on the side surfaces of the conductive interconnects 7 and 8 which are close to each other. On the other side surfaces, the metal interconnects are exposed (FIG. 1(E)).

If the conductive interconnects in the states shown in FIGS. 1(C) and 1(E) are heat-treated, then hillocks and whiskers, 11 and 12, are produced at the side surfaces of the conductive interconnects, as shown in FIG. 1(F), because the anodic oxide film 5 is not formed on these side surfaces of the conductive interconnects. However, if hillocks and whiskers are produced on these portions, little defects are created because the conductive interconnect spacing is large. In a portion 13 where the interconnect spacing is small, the anodic oxide film 5 exists on the side surfaces of the interconnects and, therefore, neither hillocks nor whiskers are produced (FIG. 1(F)).

If the anodic oxide film 5 were not present, then hillocks and whiskers, 16, would be produced at portions where the interconnect spacing is small. As a result, the conductive interconnects 7 and 8 would be shorted to each other (FIG. 1(G)).

Of course, in the present invention, the anodic oxide film 4 covers the whole top surface of each metal interconnect. Therefore, little vertical hillocks and whiskers are produced. Defects due to interlayer shorts can also be reduced.

In order to prevent interconnect shorts by forming an anodic oxide film on the surfaces of the conductive interconnects so as to prevent hillocks and whiskers, it has been necessary to form the anodic oxide film at the following two locations: (1) of the top surface of each interconnect, at least the portion intersecting a conductive interconnect in the upper layer; and (2) of the side surface of each interconnect, at least those portions which are close to other conductive interconnects and those portions which intersect a conductive interconnect in the upper layer.

The former is necessary to prevent interlayer shorts, while the latter is required to prevent shorts between adjacent interconnects and interlayer shorts. To satisfy these requirements, it is common practice to form an anodic oxide film over the whole top surface of each conductive interconnect and also over the whole side surface of each interconnect. As a consequence, the problems already pointed out have occurred.

On the other hand, in the present invention, slits are formed in only required portions before the metallization layer is patterned. An anodic oxide film is formed over the whole top surface of each conductive interconnect. However, with respect to the side surface of each interconnect, the anodic oxide film is formed only on the minimum required portion. Therefore, the degree of freedom is increased compared with the degree of freedom offered by the prior art techniques. Consequently, the problems can be solved with greater ease.

Furthermore, the thickness of the formed anodic oxide film is prevented from becoming nonuniform. Also, generation of stress can be prevented.

The thickness of the anodic oxide film is prevented from becoming nonuniform for the following reason. The conductive interconnects are formed from the layer of metallization. Most of the metallization layer is left as a film. The slits are formed in parts of the metallization layer. Under this condition, an anodization process is performed. As a consequence, the voltage drop developed during the anodization can almost be neglected.

The generation of stress can be prevented for the following reason. Unlike the method consisting of photolithographically patterning a metallization layer into complex fine lines and then effecting an anodization process, the film provided with slits in certain portions is anodized. Consequently, the produced stress results in almost no problem.

Other objects and features of the invention will appear in the course of the description thereof, which follows.

DETAILED DESCRIPTION OF THE INVENTION

EXAMPLE 1

Figure 1A:
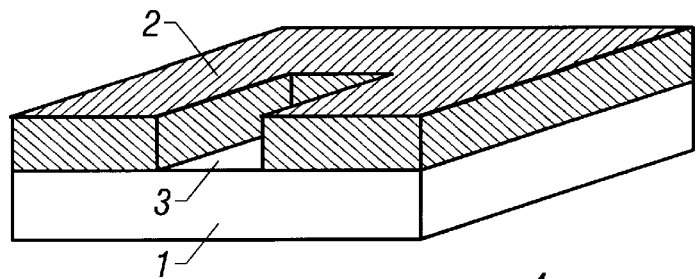
FIGS. 1(A)–1(G) are views illustrating the concept of a method according to the present invention.
Figure 1B:
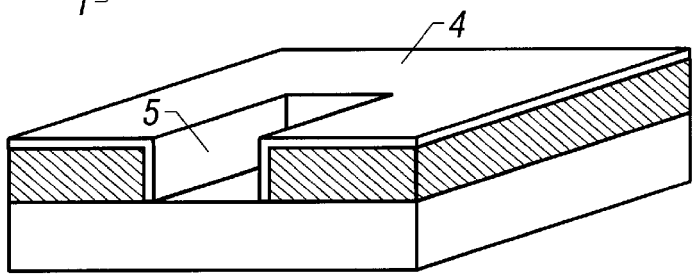
Figure 1C:
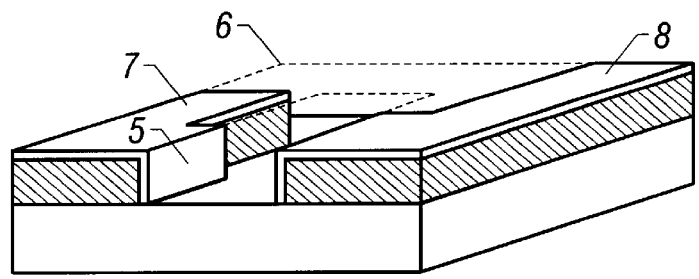
Figure 1D:
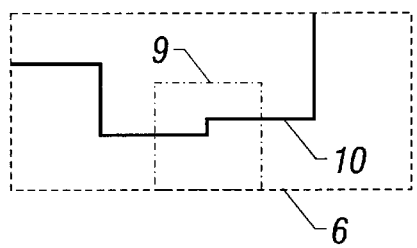
Figure 1E:
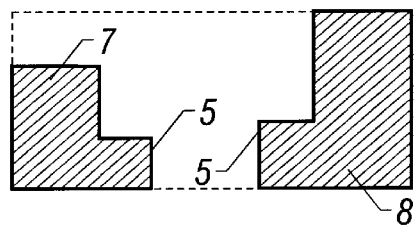
Figure 1F:
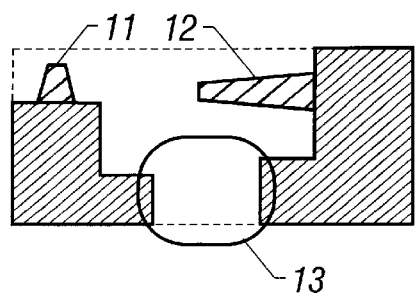
Figure 1G:
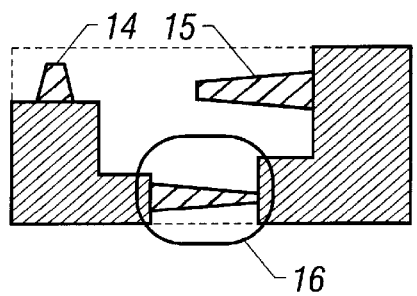
Figure 2A:
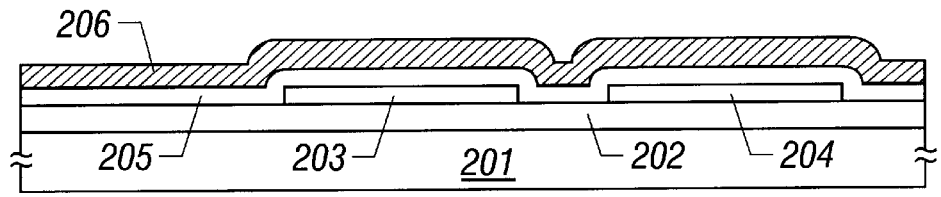
FIGS. 2(A)–2(E) are cross-sectional views of a monolithic active matrix circuit according to Example 1 of the invention, illustrating the process sequence.
Figure 2B:
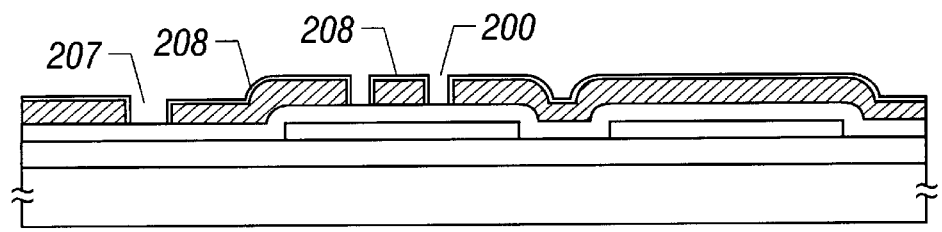
Figure 2C:
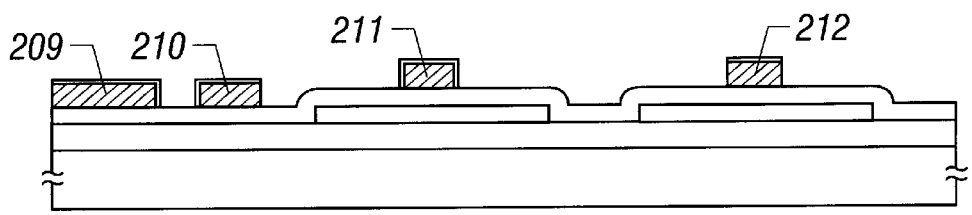
Figure 2D:
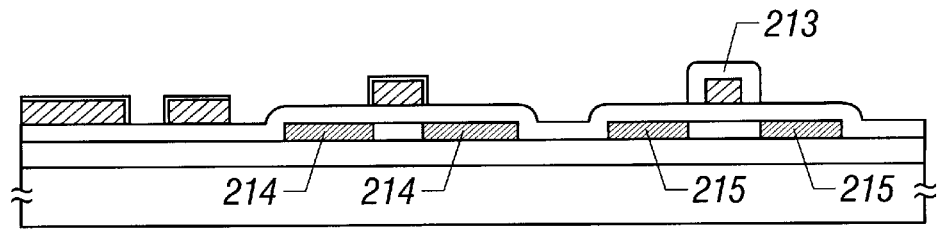
Figure 2E:
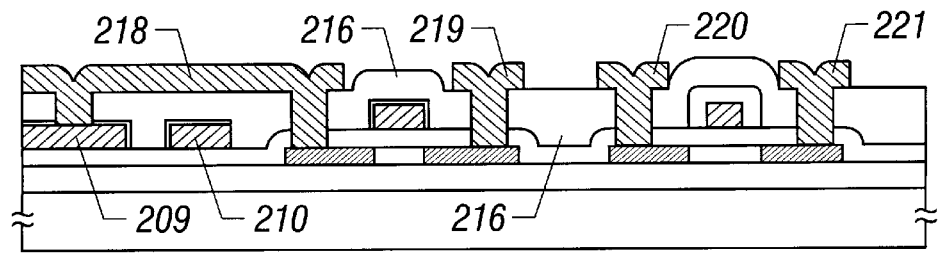
Figure 3:
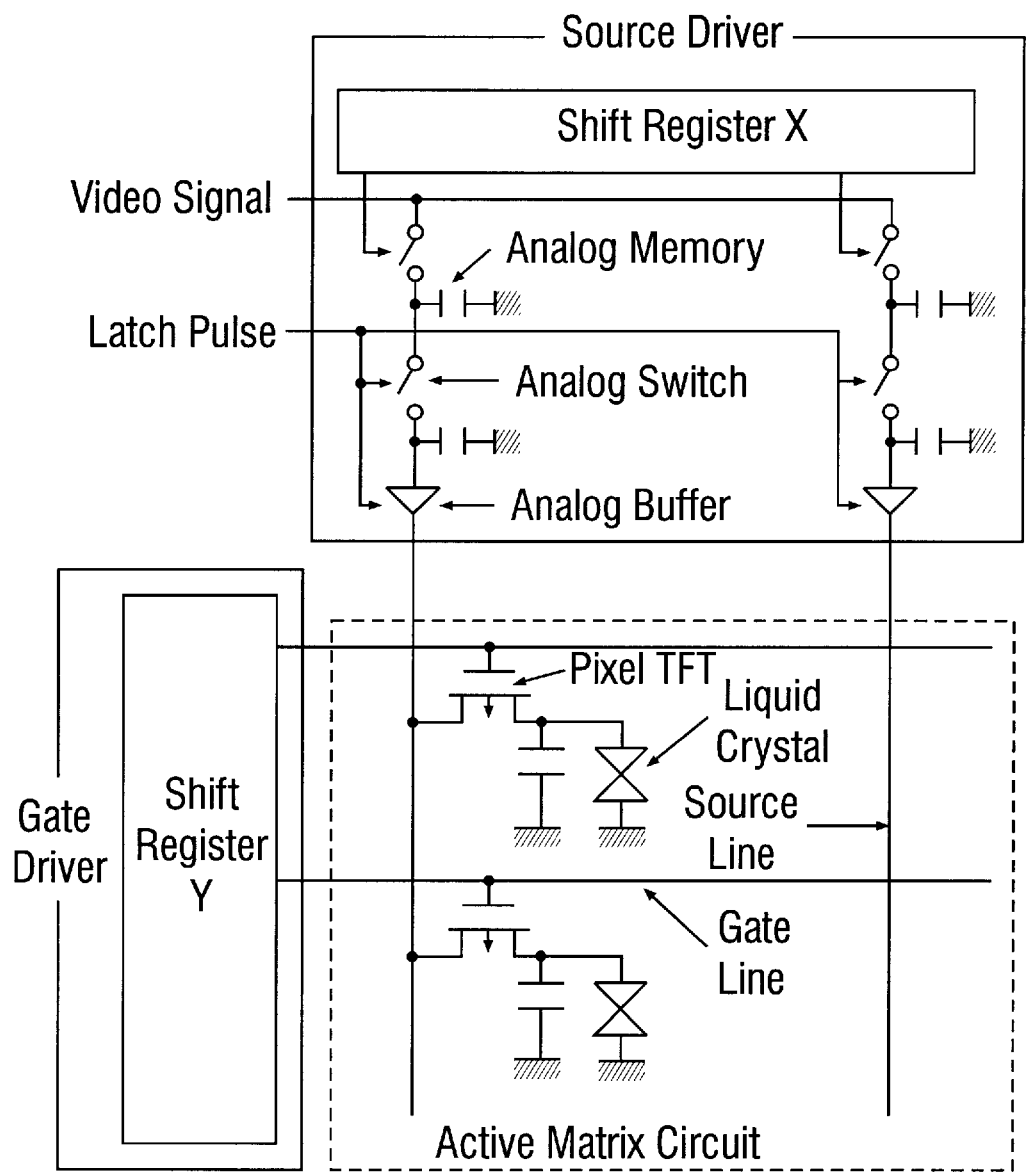
FIG. 3 is a block diagram of the monolithic active matrix circuit according to Example 1.
Figure 4A:
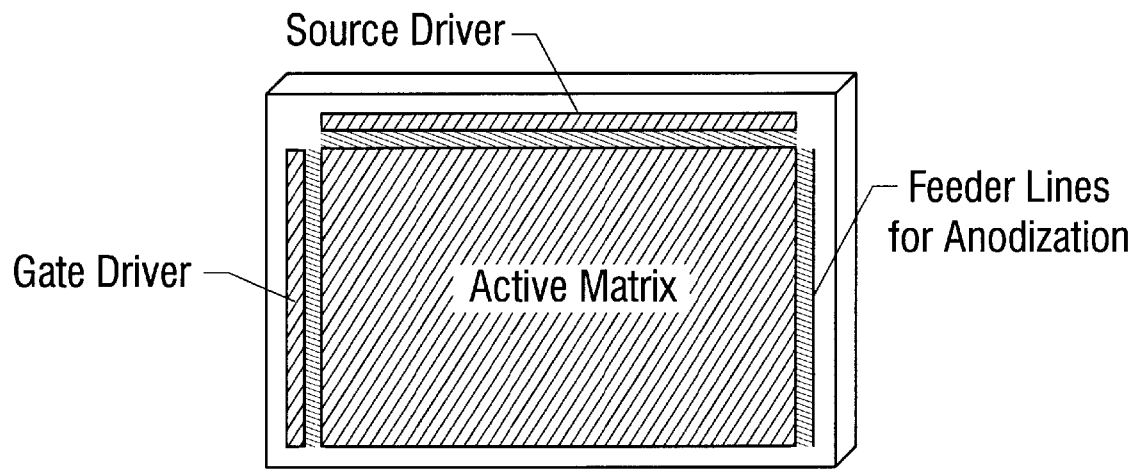
FIG. 4(A) is a schematic view of the monolithic active matrix circuit shown in FIG. 3.

The present example is described by referring to FIGS. 2(A)–2(E), 3, 4(A), and 4(B). The present example pertains to a liquid crystal display using a monolithic active matrix circuit of the structure shown in FIG. 3. FIGS. 2(A)–2(E) mainly show portions including a gate/source driver and pixel TFTs. The appearance of the active matrix circuit of the present example is shown in FIG. 4(A).

In the present example, a pixel switching transistor, or pixel TFT, has a gate electrode, and an anodic oxide is formed on the side surface of the gate electrode as described in the above-cited Japanese Patent Laid-Open No. 114724/1993 or 267667/1993. The greatest advantage obtained is that when a reverse voltage is applied to the gate (off state), the leakage current can be reduced greatly by the offset effect, as described in the above citations. This characteristic is necessary for the active matrix circuit-switching TFT which is required to hold the voltage across a capacitor or pixel with certainty and which operates dynamically.

However, in peripheral logic circuits, especially those which operate statically or semi-statically, the leakage current does not present serious problems. Especially, in an inverter circuit, a large reverse bias voltage is not applied to the gate electrode and, therefore, it is only necessary that the leakage current produced when the potential at the gate electrode is zero be practically satisfactorily small. That is, the circuit functions sufficiently even if the offset structure is not accomplished.

The gate interconnects of the active matrix portion have a quite simple structure. On the other hand, peripheral logic circuits are generally complex in structure and have complex interconnections. Furthermore, complex connections are used. If it is attempted to coat metal electrodes with anodic oxide, it is impossible to supply electric power because of complexity of the conductive interconnects. Where conductive interconnects are designed taking account of only anodization, the integration density is deteriorated greatly. Especially, it has been quite difficult to reduce design rules to less than 3 $\mu$m.

Accordingly, in the present example, the offset gate structure using anodic oxide as described in the above-cited Japanese Patent Laid-Open No. 114724/1993 or 267667/1993 is used only for pixel TFTs. The offset gate structure is not employed for the TFTs for the driver circuit but normal TFTs are used.

The process sequence for fabricating a monolithic active matrix circuit of the present invention is described below by referring to FIGS. 2(A)–2(E).

First, a silicon oxide film having a thickness of 1000 to 3000 Å was formed as a buffer oxide film 202 on a substrate 201 made of Corning 7059 glass and measuring 300 mm×300 mm or 100 mm×100 mm. This silicon oxide film may be formed by sputtering or plasma CVD in an oxygen ambient.

Then, an amorphous or crystalline silicon film was formed to a thickness of 300 to 1500 Å, preferably 500 to 1000 Å, by plasma CVD or LPCVD. In order to obtain a crystalline silicon film, an amorphous silicon film is formed, and then it is irradiated with laser light or equivalent intense light (photo-annealing) or thermally annealed at a temperature higher than 500° C. for a long time. After crystallization by thermal annealing, photo-annealing may be carried out to enhance the crystallinity. Furthermore, during crystallization making use of thermal annealing, a catalytic element for promoting crystallization of silicon such as nickel may be added, as described in Japanese Patent Laid-Open Nos. 244103/1994 and 244104/1994.

Thereafter, the silicon film was etched to form an active layer 203 (for TFTs forming the driver circuit) and an active layer 204 (for pixel TFTs). Then, a gate-insulating film 205 was formed from silicon oxide to a thickness of 500 to 2000 Å by sputtering in an oxygen ambient. The silicon oxide film forming the gate-insulating film may be created by plasma CVD.

In the present invention, the gate-insulating film 205 preferably has a sufficient breakdown voltage, because a high electric field is applied between the gate electrode and the silicon active layer during anodization step. Therefore, where the gate-insulating film is formed from a silicon oxide film obtained by plasma CVD, it is desired to use nitrogen monoxide ($N_2O$) as a gaseous raw material. Alternatively, oxygen ($O_2$) and monosilane ($SiH_4$) may be used (FIG. 2(A)).

Subsequently, an aluminum film 206 having a thickness of 2000 Å to 5 $\mu$m, preferably 2000 to 6000 Å, and containing 0.1 to 0.5% by weight of scandium was formed over the whole surface of the laminate by sputtering.

Then, as shown in FIG. 2(B), those portions of the aluminum film 206 which formed adjacent conductive interconnects were etched away, using a first mask, to form slits 207 and 200. Thereafter, the laminate was placed within an electrolytic solution. An electrical current was passed through the aluminum film 206 to form an anodic oxide film 208 on the surface of the aluminum film 206 and on the side surfaces of the slits 207 and 200. Anodization was effected under conditions similar to the conditions described in the above-cited Japanese Patent Laid-Open No. 267667/1993 except that the anodization voltage was 40 V. As a result, the thickness of the obtained anodic oxide film 208 was about 700 Å (FIG. 2(B)).

Then, using a second mask, the aluminum film 206 and the anodic oxide film 208 were etched to form conductive interconnects 209, 210 and gate electrodes/interconnects 211, 212. The gate electrodes 212 of the pixel TFTs were all designed to be connected with feeder lines (not shown) for the anodization (FIG. 2(C)).

On the other hand, the gate electrodes and interconnects, 209–211, of the peripheral logic circuit are electrically insulated from the feeder lines for the anodization. Then, the laminate was placed within an electrolytic solution, and an electrical current was passed through lead wires for the anodization to anodize the gate electrodes and interconnects 212. The anodization conditions were similar to the conditions described in the above-cited Japanese Patent Laid-Open No. 267667/1993 except that the anodization voltage was 80 V. The obtained anodic oxide film 213 had a thickness of about 1400 Å.

Figure 4B:
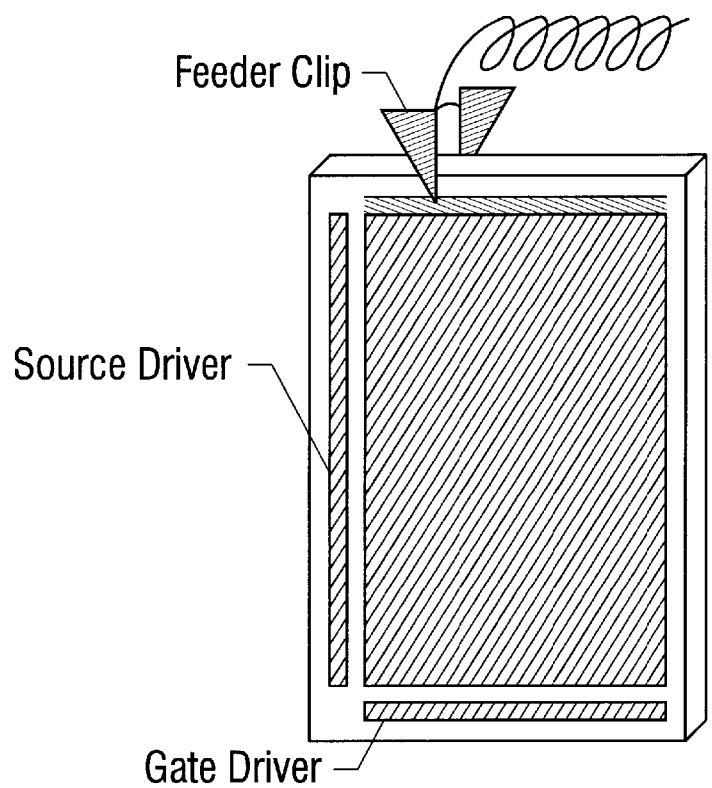
FIG. 4(B) is a view similar to FIG. 4(A), but illustrating an anodization step.

In the step for anodizing the gate electrodes and interconnects 212, the feeder lines for the anodization were attached to the laminate with feeder clips such as alligator clips, as shown in FIG. 4(B), and then an electrical current was supplied. As a result, as shown in FIG. 2(D), the anodic oxide film 213 was formed over the whole top surface and over the whole side surface of each of the gate interconnects and electrodes 212 connected with the feeder lines for the anodization.

The anodic oxide film 213 obtained by the anodization within a substantially neutral solution in this way was dense and hard and had a high breakdown voltage. The breakdown voltage was in excess of 70% of the maximum voltage applied during the anodization. This anodic oxide is referred to as anodic oxide barrier metallization.

Finally, a groove was cut at the interface between the gate electrode/interconnect 212 and the feeder line for anodization, using a diamond cutter. Thus, the gate electrode/interconnect 212 and the feeder line are cut off. This manufacturing step may also be carried out by laser scribing techniques.

Then, impurity ions were introduced into islands of active layer of the TFTs 203 and 204 by self-aligned ion implantation techniques, using the gate electrode portion (i.e., the gate electrode and its surrounding anodic oxide film) as a mask. If a CMOS circuit is used as the driver circuit, then doping may be done by well-known CMOS fabrication techniques. In the present example, phosphorus was first implanted, using phosphine ($PH_3$) as a dopant gas, into the whole surface. Then, only those portions in which N-type regions would be formed were coated with photoresist, and boron was introduced, using diborane ($B_2H_6$) as a dopant gas.

In the present example, the ion implantation was carried out under the following conditions: the dose for phosphorus was $4\times10^{14}$ to $4\times10^{15}$ atoms/cm$^2$; the dose for boron was 1 to $8\times10^{15}$ atoms/cm$^2$. The dose for boron was set higher than that for phosphorus. The accelerating voltage for phosphorus was 80 to 95 kV. The accelerating voltage for boron was 60 to 75 kV. As a result, an N-type region 214 for the driver circuit and an N-type region 215 for a pixel TFT were formed. A P-type region (not shown) for the driver circuit was similarly formed (FIG. 2(D)).

Then, the laminate was illuminated with KrF excimer laser having a wavelength of 248 nm and a pulse width of 20 nsec to heal the crystallinity of the portions deteriorated by the impurity implantation. The energy density of the laser light was 200 to 400 mJ/cm$^2$, preferably 250 to 300 mJ/cm$^2$. The result is that the N- and P-type regions were activated. The sheet resistance of these regions was 200 to 800 Ω/square.

Thereafter, silicon oxide was formed as an interlayer dielectric 216 over the whole surface to a thickness of 3000 to 6000 Å by plasma CVD. This interlayer dielectric may also be made of a silicon nitride film or a multilayer film of silicon oxide and silicon nitride. The interlayer dielectric 216 was etched by a wet-etching process to form contact holes in the N- and P-type regions. A titanium film having a thickness of 2000 to 6000 Å was formed by sputtering, followed by etching of the titanium film. In this way, electrodes/interconnects, 218 and 219, for the driver circuit and electrodes, 220 and 221, for the pixel TFTs were formed. As a consequence, a peripheral logic circuit and an active matrix circuit were formed integrally (FIG. 2(E)).

Then, pixel electrodes were formed from a transparent conductive film of ITO (indium-tin oxide) by sputtering techniques, thus completing the TFT substrate of the active matrix display. In the structure of the present example, the presence of the anodic oxide film 208 formed on the side surfaces of the conductive interconnects 209 and 210 prevent these interconnects 209 and 210 from being shorted to each other. In the present example, those portions over which a relatively thick anodic oxide film exceeding a thickness of 1000 Å is required to be formed by anodizing the aluminum interconnects, such as the gate electrodes/ interconnects 212 of the pixel TFTs, exist in some parts of the circuitry. The present invention can be applied with great utility to such circuitry.

More specifically, in the prior art techniques, in order to prevent hillocks and whiskers, silicon was added to aluminum forming gate electrodes/interconnects. However, it is not appropriate to add a large amount of silicon to aluminum in forming a thick anodic oxide film enabling the offset structure. Normally, as described in the present example, aluminum to which a low concentration of impurity is added is used. For this reason, on the interconnects excluding the portions over which a thick anodic oxide film is formed, hillocks and whiskers are often formed. The present invention can effectively remove these problems.

In the present example, the side surfaces of the electrodes and interconnects of the TFTs forming the driver circuit are partially anodized to form a minimum anodic oxide. With respect to TFTs forming a complex circuit of an especially high integration density, such as TFTs forming the shift register circuit shown in FIG. 3, slits are formed in the gate interconnects in the same way as in the present example, and a minimum anodic oxide is formed. With respect to the other TFTs, anodic oxide can be formed over the whole periphery of each gate electrode. These TFTs may be made to have the offset structure in the same way as pixel TFTs.

EXAMPLE 2

Figure 6A:
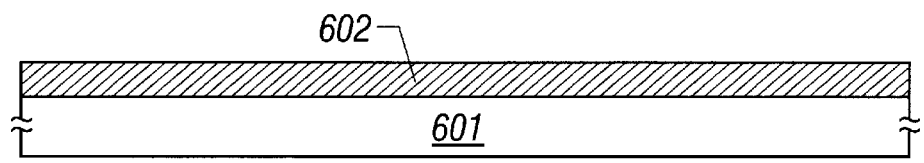
FIGS. 6(A)–6(C) are cross-sectional views of a monolithic active matrix circuit, illustrating a method of forming conductive interconnects in accordance with Example 2 of the invention.
Figure 6B:
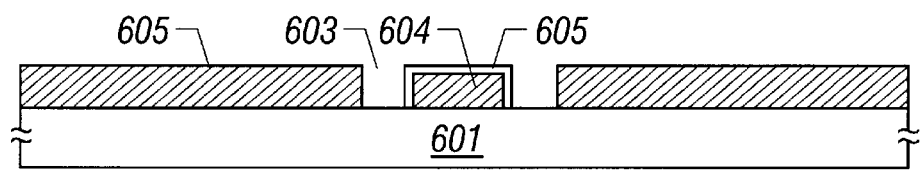
Figure 6C:
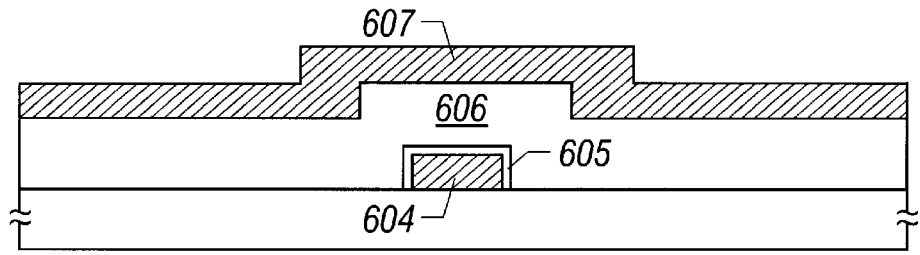

The present example is characterized in that the structure shown in FIGS. 6(A)–6(C) is adopted. Where a thin-film integrated circuit is fabricated, it may he necessary that upper conductive interconnects intersect lower conductive interconnects. In this case, if the metallization is made of aluminum or a material consisting mainly of aluminum, then hillocks and whiskers cause vertical shorts between the intersecting interconnects which are at different levels.

This problem is solved by the aforementioned technique. That is, aluminum interconnects are formed as mentioned above, and then an oxide film is formed on the exposed top and side surfaces by anodization. However, if anodization is carried out after formation of conductive interconnects, stress produced by the anodization causes the interconnects to deform and break, thus resulting in numerous defects. This impairs the production yield. This phenomenon is especially conspicuous where a complex circuit pattern is formed.

Figure 5A:
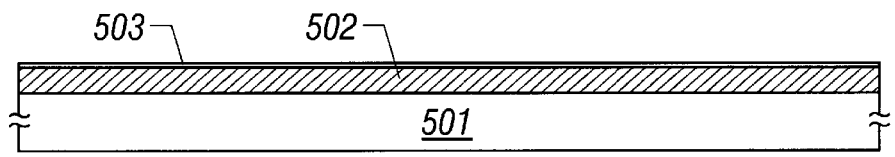
FIGS. 5(A)–5(C) are cross-sectional views of a monolithic active matrix circuit, illustrating the prior art method of forming conductive interconnects.
Figure 5B:
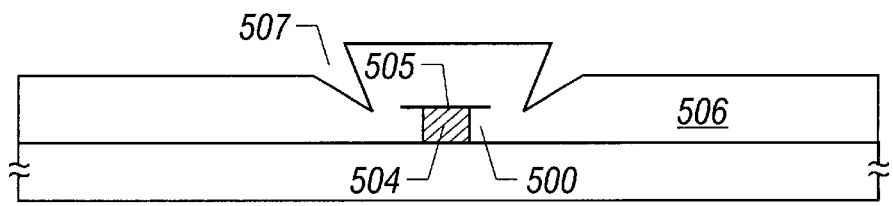
Figure 5C:
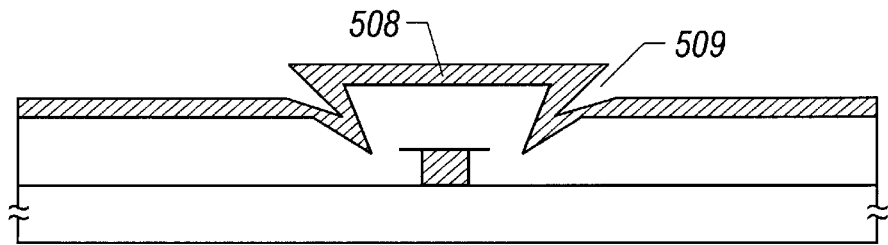

A method for circumventing this phenomenon is to form an anodic oxide film on the surface of the film of metallization from which conductive interconnects will be formed by patterning. An example utilizing this method is illustrated in FIGS. 5(A)–5(C). First, a metallization film 502 is formed from aluminum or a material consisting chiefly of aluminum by sputtering or other method either on a substrate having an insulating surface or on a base (e.g., the surface of a dielectric film).

This metallization film consisting mainly of aluminum is designed to be patterned into various conductive interconnects. Under this condition, a thin, dense anodic oxide film 503 is formed on the surface by an anodization step (FIG. 5(A)).

The formation of the anodic oxide film 503 prevents vertical hillocks and whiskers. Hence, shorts between intersecting conductive interconnects at different levels can be prevented.

Then, the metallization film 502 consisting chiefly of aluminum is etched to form an interconnection pattern 504. If a wet-etching process is employed to etch the metallization film consisting mainly of aluminum, then isotropic etching progresses. As a result, the side surfaces 500 of the conductive interconnects 504 are thinned.

After forming the conductive interconnects 504, an interlayer dielectric film 506 is formed. This is followed by formation of a second layer of metallization. At this time, portions with poor step coverage as indicated by 507 are formed on the surface of the interlayer dielectric film 506, because the side surfaces 500 of the interconnects 504 are etched during the patterning for formation of the conductive interconnects (FIG. 5(B)).

In this state, if a conductive interconnect 508 intersecting the interconnects 504 is formed, then the interconnect 508 will break, a partial resistance increase will occur, or other problems will take place in a region 509 (FIG. 5(C)).

In the method described above, the conductive interconnects are neither deformed nor caused to break by stress produced during anodization. Hence, this method is effective in preventing vertical shorts. However, as indicated by 509 in FIG. 5(C), defects are induced on the upper conductive interconnects.

In order to solve this problem, in the present example, the structure shown in FIGS. 6(A)–6(C) is adopted. First, a metallization film 602 consisting chiefly of aluminum is formed either on a substrate having a dielectric surface or on a base 601 (FIG. 6(A)).

A first patterning step is performed at portions where conductive interconnects formed later will intersect, thus forming slits 603. These slits 603 are formed only in the upper layer of metallization. An anodic oxide film is formed by an anodization step. It follows that an anodic oxide film 605 is formed on the side surfaces of the slits (FIG. 6(B)).

Under the condition shown in FIG. 6(B), a portion 604 will form a part of conductive interconnects later. A second patterning step is carried out to form electrodes and conductive interconnects 604 in the first layer (FIG. 6(C)).

During this patterning step, the side surfaces of the electrodes and interconnects 604 at the intersections where the electrodes and interconnects 604 in the first layer cross the upper layer of metallization (which will form the second layer of interconnects) are not etched, because of the presence of the slits 603.

An interlayer dielectric film 606 is formed. The problems described in connection with FIGS. 5(A)–5(C) do not occur at this time. Then, the second layer of metallization 607 is formed. In this structure, portions similar to the portion 509 shown in FIG. 5(C) are not formed in the second layer of metallization and so defects can be prevented.

EXAMPLE 3

Figure 7A:
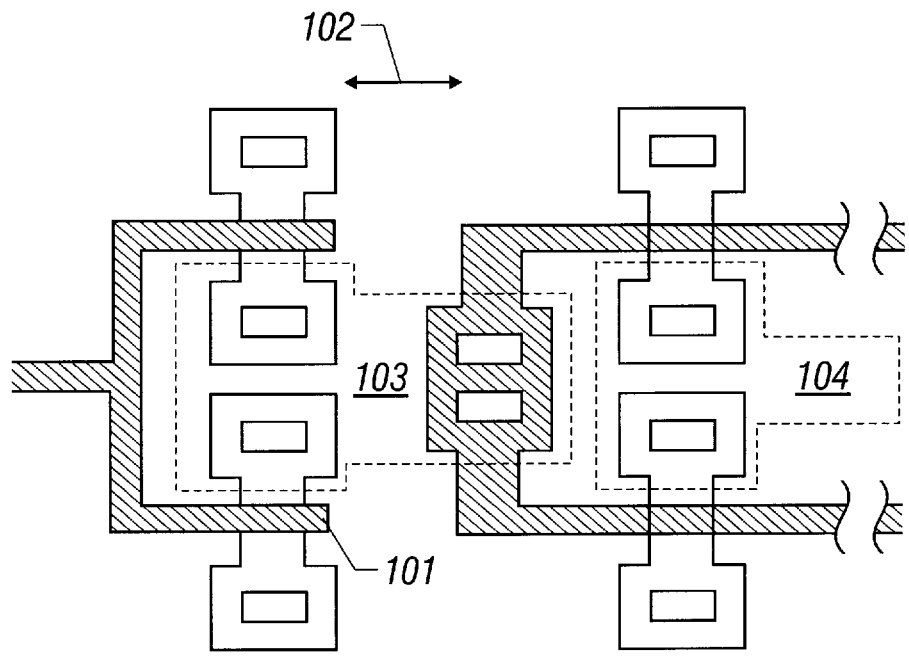
FIG. 7(A) is a diagram of a thin-film integrated circuit according to Example 3 of the invention.
Figure 7B:
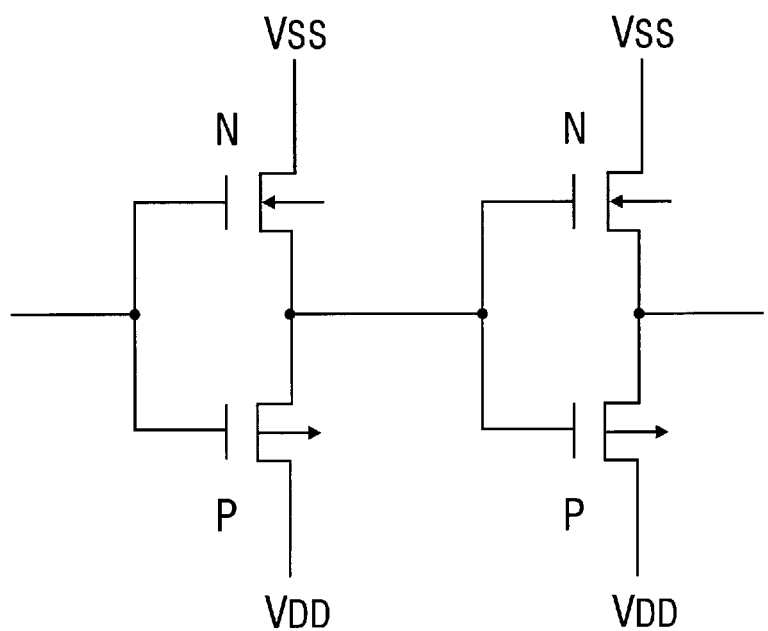
FIG. 7(B) is an equivalent circuit diagram of the circuit shown in FIG. 7(A)

In the present example, thin-film transistors (TFTs) using crystalline thin-film silicon are packed at a high density, thus forming a thin-film integrated circuit. An example of the thin-film integrated circuit described in the present example is shown in FIGS. 7(A) and 7(B). FIG. 7(B) is an equivalent circuit of FIG. 7(A). The structure shown in these figures comprises two stages of inverter circuits, each stage consisting of a complementary pair of an N-channel TFT and a P-channel TFT.

The circuit shown in FIGS. 7(A) and 7(B) is used as an analog buffer circuit forming a peripheral driver circuit for an active matrix liquid crystal display as shown in FIG. 3. The fundamental, simple configuration is shown in FIGS. 7(A) and 7(B). In practice, the illustrated circuit and other necessary circuits are combined in a complex manner to complete a thin-film integrated circuit. Where a circuit as shown in FIGS. 7(A) and 7(B) is used in an active matrix liquid crystal display, a glass substrate is used as a substrate. A thin-film transistor is fabricated, making use of a thin-film semiconductor formed on a glass substrate.

In the circuit shown in FIGS. 7(A) and 7(B), the shaded portion 101 is a part of gate interconnects, and an extending portion forms a gate electrode. Conductive interconnects 103 connect the output of the first stage of inverter circuit with the input of the second stage of inverter circuit. These interconnects 103 are included in the second layer of metallization formed on an interlayer dielectric film (not shown), which is in turn formed on top of the gate interconnect 101. For the sake of convenience, the interconnect 101 is referred to as an interconnect in the first layer of metallization, and the interconnects 103 are referred to as interconnects in the second layer of metallization.

Generally, the thickness of the interlayer dielectric film is more than 5000 Å. Therefore, the gate interconnect 101 in the first layer of metallization and the interconnect 103 in the second layer of metallization are vertically spaced a distance of more than 5000 Å from each other via the interlayer dielectric film. Furthermore, these two interconnects are horizontally spaced a distance indicated by the arrow 102 from each other.

Figure 8A:
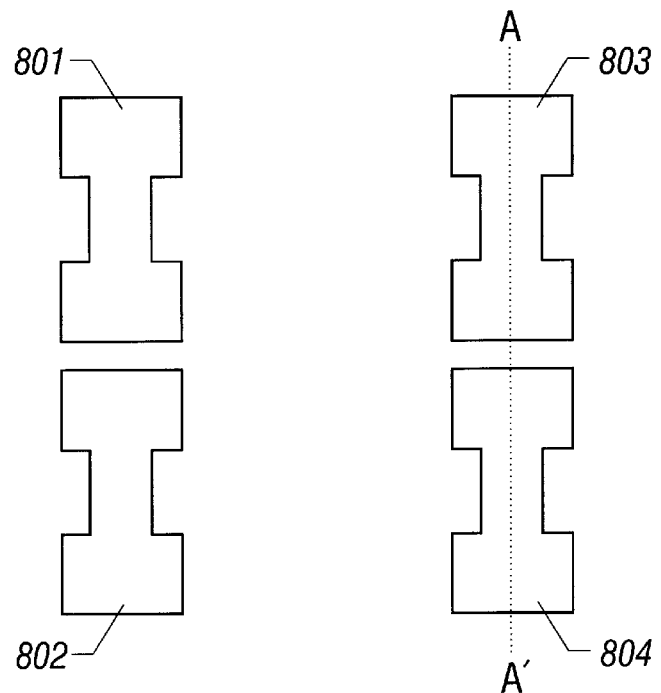
FIGS. 8(A) and 8(B) are views, illustrating the sequence for fabricating the thin-film integrated circuit according to Example 3.

The process sequence for fabricating thin-film semiconductor circuit shown in FIGS. 7(A) and 7(B) is illustrated in FIG. 8(A) and the following figures. In the present example, a glass substrate is used as a substrate. A semiconductor substrate having a dielectric film formed on its surface and other substrates made of other materials having dielectric surfaces may also be used.

First, silicon oxide is formed as a buffer film on a glass substrate (not shown). Then, an amorphous silicon film (not shown) is formed on the buffer film by plasma CVD or LPCVD. The thickness of the buffer film is 3000 Å, for example. The thickness of the amorphous silicon film is 500 Å, for example. The amorphous silicon film is crystallized by heat treatment, laser illumination, or combination thereof.

Subsequently, the crystallized silicon film is patterned into islands of silicon film 801–804 forming an active layer of a thin-film transistor as shown in FIG. 8(A). The patterning step may utilize well-known photolithography techniques. That is, a resist mask is formed. Unwanted crystalline silicon film portions are etched away by wet etching or dry etching so as to form the islands of silicon film. As a result of this step, islands of silicon film 801–804 are formed.

Figure 10A:
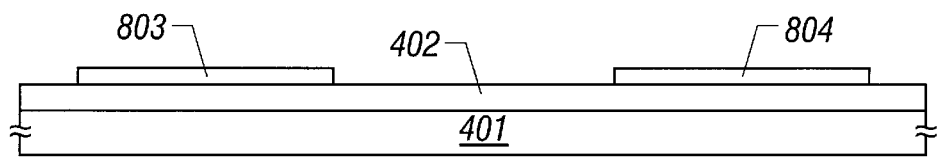
FIGS. 10(A)–10(D) are cross-sectional views of a thin-film integrated circuit, illustrating the process sequence of Example 3.

FIG. 10(A) is a cross-sectional view taken on line A–A' of FIG. 8(A). In FIG. 10(A), indicated by 401 is a glass substrate. Indicated by 402 is a buffer film of silicon oxide formed on the glass substrate.

Figure 8B:
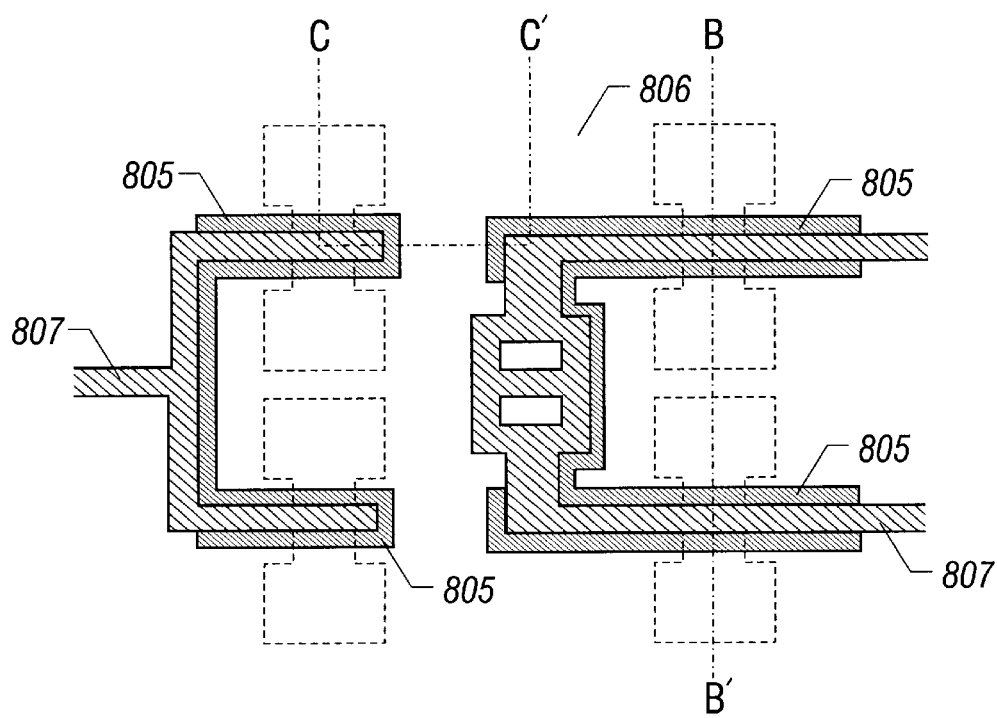
Figure 10B:
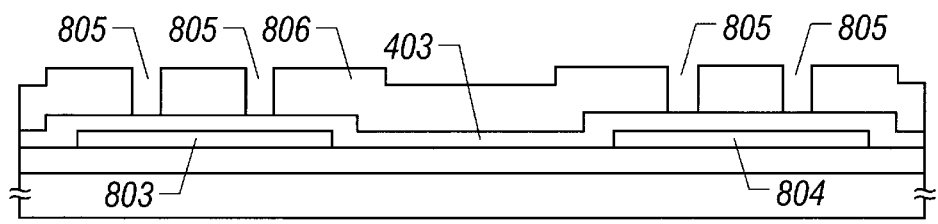

Then, as shown in FIG. 10(B), silicon oxide (not shown in FIGS. 8(A) and 8(B)) is formed as a gate-insulating film 403 by plasma CVD or sputtering. Generally, the thickness of this silicon oxide film is about 1000 to 1500 Å.

Thereafter, a metallization film 806 consisting chiefly of aluminum is formed by sputtering or electron-beam evaporation. Gate electrodes and conductive interconnects extending from the gate electrodes will be formed from this metallization film 806. The thickness of the metallization film 806 is 5000 Å, for example.

In this example, aluminum forming the metallization film 806 contains 0.2% by weight of scandium to suppress generation of hillocks and whiskers which would otherwise be produced by heating or laser illumination during a later process step. In this way, generation of hillocks and whiskers can be suppressed by adding a rare-earth element to aluminum but cannot be completely prevented. Instead of the rare-earth element, silicon may be used.

After forming the metallization film 806 consisting mainly of aluminum over the whole surface, slits are formed in regions where hillocks and whiskers should not be produced. These regions where the slits should be formed are partially exposed by a resist mask and a wet etching or dry etching process is carried out. In the present example, the hatched portions 805 in FIG. 8(B) are the slits. The width of the slits is about 1 to 30 μm and appropriately determined according to the design rules. Those portions in which the slits 805 are not formed are totally capped with the aluminum-based metallization film 806. In a later step, the metallization film 806 consisting chiefly of aluminum will be patterned into an interconnection pattern 807.

As can be seen from FIG. 8(B), the slits 805 are formed so that some of the side surfaces of the interconnection pattern are exposed, to form an anodic oxide film on selected portions of the interconnection pattern.

Under this condition, an anodization step is performed within an electrolytic solution, using the metallization film 806 as an anode. Because of this anodization, a dense anodic oxide film 302 having a thickness of about 600 Å is formed on the surface. The electrolytic solution is prepared by neutralizing 3% tartaric acid with ammonia and diluting the resulting solution with ethylene glycol by a factor of 10. During the anodization, the maximum applied voltage is 40 V. The formed anodic oxide film 302 consists mainly of $Al_2O_3$, and is a dense, hard dielectric film.

During this anodization step, the anodic oxide film 302 is also formed inside the slits 805. Throughout this anodization step, most regions are capped with the metallization film consisting chiefly of aluminum and so various problems can be suppressed. That is, deformation of the pattern caused by stress produced during the anodization can be suppressed. Also, nonuniformity of the thickness of the anodic oxide film attributed to a voltage drop can be suppressed.

Especially, since the anodic oxide film is not formed in portions where conductive interconnects are laid over a long distance, the problems caused by a voltage drop can be suppressed. This, in turn, permits formation of a final microcircuit pattern.

FIG. 10(B) is a cross-sectional view taken on line B–B' of FIG. 8(B). In FIG. 10(B), the silicon oxide film 403 acts as the gate-insulating film. The metallization film 806 consists chiefly of aluminum. Gate electrodes will later be formed from this metallization film 806. As shown in FIG. 10(B), the metallization film 806 is left on most regions and so the aforementioned problems associated with stress and voltage drop can be suppressed.

Figure 10C:
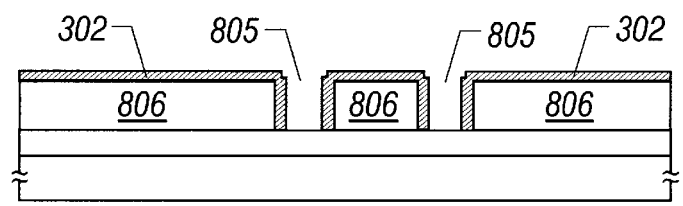

FIG. 10(C) is a cross-sectional view taken on line C–C' of FIG. 8(B). In FIG. 10(C), an anodic oxide film 302 (not shown in FIG. 8(B)) is formed by an anodization step. Indicated by numeral 805 are slits.

After the completion of the anodization, the metallization film 806 consisting mainly of aluminum is patterned to form the aforementioned interconnection pattern 807. In this way, a required interconnection pattern is obtained.

Figure 9A:
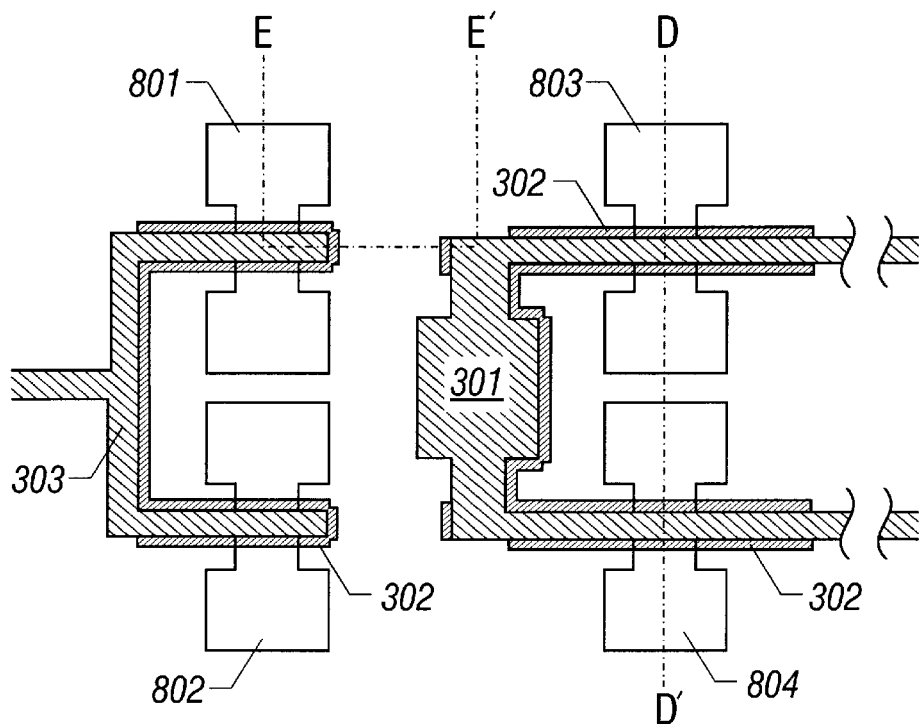
FIGS. 9(A) and 9(B) are views, illustrating the sequence for fabricating the thin-film integrated circuit according to Example 3.
Figure 10D:
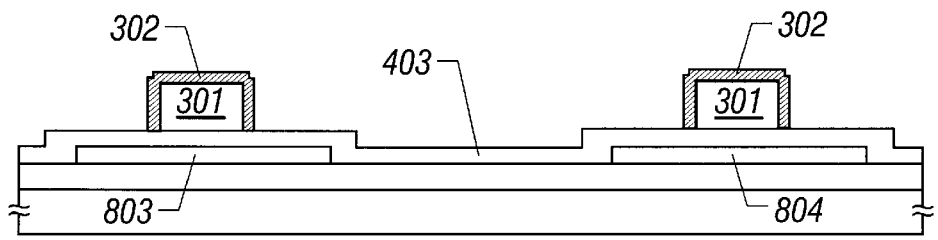

In this manner, as shown in FIGS. 9(A) and 10(D), gate interconnects 301 and 303 are formed. An anodic oxide film 302 is formed only on the side surfaces of the gate interconnects 301 and 303. The whole top surface of each gate interconnect is capped with the anodic oxide film. In this manner, the state shown in FIGS. 9(A) and 10(D) is obtained. FIG. 10(D) is a cross-sectional view taken on line D–D' of FIG. 9(A).

Then, phosphorus (P) ions are introduced into the whole surface. Subsequently, B ions are introduced while coating regions 802 and 804 with a resist mask. As a result, N-type source/drain regions are formed in the active layers 801 and 803. P-type source/drain regions are formed in the regions 802 and 804.

After the introduction of the ions, the laminate is illuminated with laser light to activate the implanted ions and to heal the ion implantation damage to the active layers by annealing. As a consequence, N-channel and P-channel TFTs are formed. In this way, two sets of P- and N-type TFTs for forming the inverter circuit as shown in FIG. 7(B) are created.

In FIG. 9(A), the N-channel TFTs have active layers 801 and 803. The P-channel TFTs have active layers 802 and 804.

During the ion implantation and during the laser illumination, the gate interconnects 301 and 303 are heated. However, those portions of these interconnects which are coated with the anodic oxide film 302 are free from hillocks and whiskers. On the other hand, those portions which are not coated with the anodic oxide film 302 suffer from hillocks and whiskers.

Importantly, the anodic oxide film 302 is formed only on the regions where shorts may occur between horizontally or vertically adjacent conductive interconnects in the presence of hillocks and whiskers.

Figure 9B:
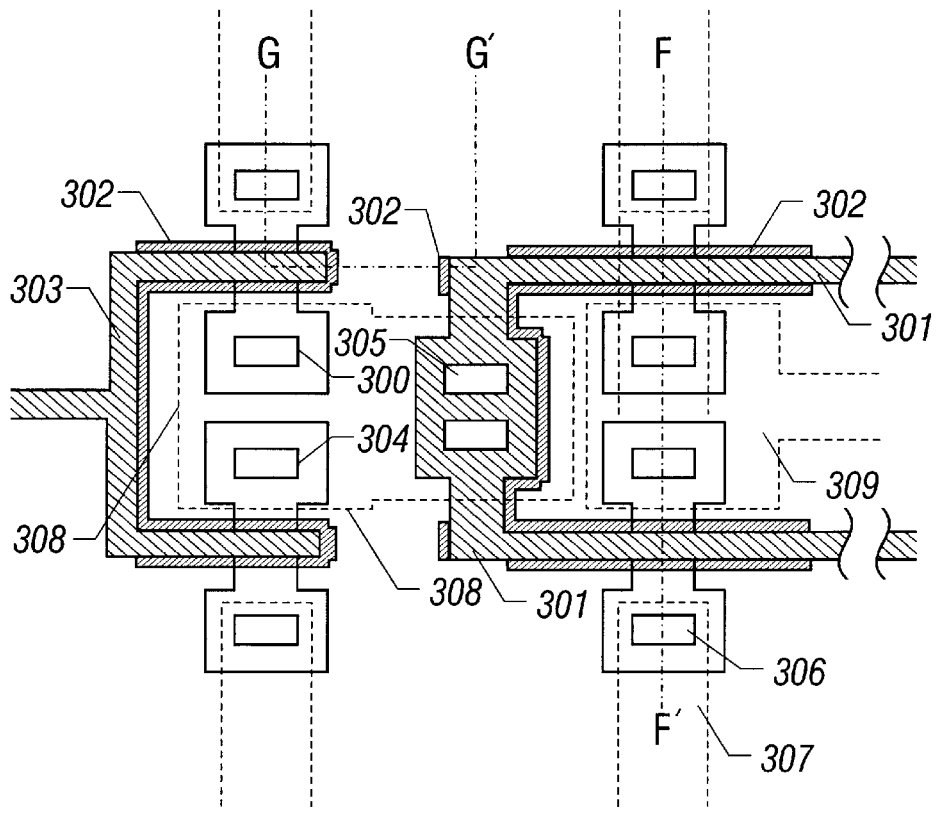

After obtaining the state shown in FIG. 9(A), a silicon oxide film is formed as an interlayer dielectric film (not shown in FIGS. 9(A)–9(B)). The gate interconnects 301 and 303 are coated with this silicon oxide film. This silicon oxide film is formed to a thickness of about 6000 Å by plasma CVD. It is necessary that this silicon oxide film be formed by a method providing good step coverage.

Then, contact holes communicating with the gate interconnects and with the source/drain regions of the active layer are formed. The contact holes are indicated by 300, 304–306, for example, in FIG. 9(B). The contact hole 300 is in communication with the drain region in the active layer 801. The contact hole 304 is in communication with the drain region in the active layer 802. The contact hole 305 is in communication with the gate interconnect 301. The contact hole 306 is in communication with the source region in the active layer 804.

The second layer of metallization (not shown in FIGS. 9(A) and 9(B)) is formed from a material consisting chiefly of aluminum over the whole surface. The first layer of metallization includes the gate interconnects 301 and 303. This second layer of metallization is patterned to form conductive interconnects 307–309.

In FIG. 9(B), parts of the conductive interconnects in the second layer of metallization are indicated by numerals 307–309. Indicated by 307 is an electrode (conductive interconnect) connected with the source region of the P-channel TFT. The interconnect 308 is made to contact the drain regions of the upper and lower TFTs forming the first stage of converter circuit via the contact holes 300 and 304. At the same time, the interconnect 308 is made to contact the drain interconnect 301. This interconnect 308 acts to connect the output of the first stage of inverter circuit with the input of the second stage of inverter circuit. The interconnect 309 is connected with the output of the second stage of inverter circuit.

These conductive interconnects 307–309 are connected with the source/drain regions of the TFTs. These interconnects 307–309 are formed on the interlayer dielectric film (not shown). The gate interconnects 301 and 303 are vertically spaced from each other by the interlayer dielectric film.

Figure 11A:
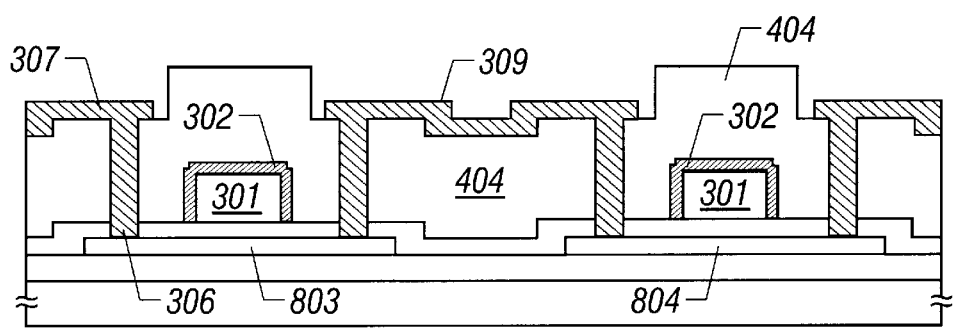
FIGS. 11(A) and 11(B) are cross-sectional views of a thin-film integrated circuit, illustrating the process sequence of Example 3.
Figure 11B:
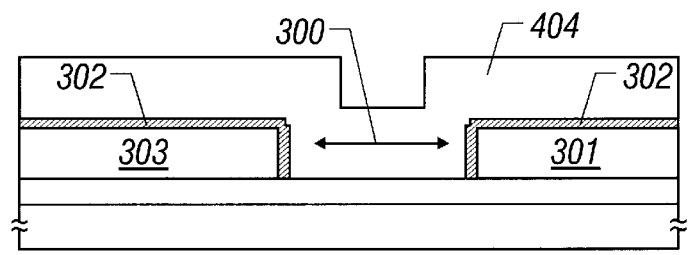

FIG. 11(A) is a cross-sectional view taken on the line F–F' of FIG. 9(B). FIG. 11(B) is a cross-sectional view taken on the line G–G' of FIG. 9(B). In FIG. 11(A), an interlayer dielectric film 404 is made of silicon oxide.

The conductive interconnects 307–309 in the second layer of metallization are free from hillocks and whiskers, because after formation of the second layer of metallization, heating or laser illumination which would normally produce hillocks and whiskers is not done. The device characteristics can be enhanced effectively by making a heat treatment in a hydrogen ambient after the formation of the conductive interconnects 307–309 in the second layer. Since this heat treatment is made at 350° C. for about 1 hour, no hillocks are produced in the interconnects 307–309 in the second layer.

In this way, a circuit as shown in FIG. 9(B) equivalent to the circuit shown in FIG. 7(A) is completed. Where a circuit as shown in FIG. 9(B) is constructed, the gate interconnects 301 and 303 can prevent hillocks and whiskers from causing shorts. In particular, the anodic oxide film 302 is formed in portions where the gate interconnects 301 and 303 may be short-circuited if hillocks and whiskers are produced. In these portions, the anodic oxide film acts as a barrier, thus preventing hillocks and whiskers.

As a result, the first stage of inverter and the second stage of inverter can be placed close to each other. That is, the distance indicated by 300 in FIG. 11(B) can be reduced. This distance is indicated by the arrow 102 in FIG. 7(A). This is important in enhancing the device density of the integrated circuit. FIG. 11(B) is a cross-sectional view taken on the line G–G' of FIG. 9(B).

Furthermore, the anodic oxide film 302 formed on parts of the gate interconnects 303 and 301 prevent the conductive interconnects 303 and 301 from being short-circuited to the conductive interconnects 307–309 in the second layer, for the following reason. As viewed from the top or bottom surface, the anodic oxide film is formed on the top and side surfaces of the gate interconnects in portions where the gate interconnects 303 and 301 are close to the interconnects 307–309 in the second layer. That is, in these portions, the anodic oxide film suppresses generation of hillocks and whiskers on the gate interconnects. As a consequence, the gate interconnects in these portions are prevented from touching the interconnects in the second layer.

For example, where the gate interconnects or gate electrodes are made of aluminum, it is inevitable that they are heated during impurity ion implantation for formation of the source/drain regions and during laser illumination or thermal annealing for activation of the source/drain regions. It follows that hillocks and whiskers are produced on the side surfaces of the gate interconnect 301. As a result, the gate interconnect 301 in the first layer shown in FIG. 11(A) is often short-circuited to the interconnect 307 in the second layer, the interconnect 307 extending into the contact hole 306.

Where the structure shown in the present example is adopted, the presence of the anodic oxide film 302 can suppress generation of hillocks and whiskers on the gate interconnect 301 on the cross section shown in FIG. 11(A).

Therefore, the gate interconnect 301 and the interconnect 307 in the second layer can be prevented from being shorted to each other. Furthermore, the contact hole 306 can be formed with greater ease, because hillocks and whiskers are prevented from being produced on the gate interconnect 301. Additionally, in the contact hole 306, the interconnect 307 is prevented from poorly contacting the active layer 803 (source region in this example). This is also effective in miniaturizing the TFT and enhancing the device density.

In the present example, in the stage prior to patterning for creating conductive interconnects, slits are formed in only required locations. Then, an anodization step is carried out. Consequently, nonuniformity of the thickness of the anodic oxide film attributed to a voltage drop can be suppressed. Also, generation of a stress which would normally be induced by effecting anodization after forming a microcircuit pattern can be suppressed. Advantages can be obtained by forming an anodic oxide film around conductive interconnects and electrodes. At the same time, difficulties which would normally be created by carrying out anodization can be eliminated.

Accordingly, the present invention provides a monolithic active matrix circuit of a quite high integration density. For instance, we have found that the present invention is effective in designing circuits with design rules of less than 3 $\mu$m. In this way, the present invention is industrially advantageous.

What is claimed is:

1. A method of fabricating a semiconductor integrated circuit comprising the steps of:
    forming a film of metallization capable of being anodized on a substrate;
    etching said film of metallization, using a first mask, to form slits which contain substantially no metallization;
    anodizing said film of metallization to form a barrier type anodic oxide film on a surface of said film of metallization and on side surfaces of said slits; and
    etching said film of metallization into an interconnection pattern, using a second mask.

2. The method of claim 1 wherein obtained conductive interconnects are flush with gate electrodes of thin-film transistors.

3. The method of claim 1 wherein said film of metallization is aluminum containing 0.1–0.5% by weight of scandium, yttrium, or zirconium.

4. The method of claim 1 wherein said slits have widths of less than 2 $\mu$m.

5. The method of claim 1 wherein said step of anodizing said film of metallization is carried out at a voltage of less than 80 V.

6. A method of fabricating a semiconductor integrated circuit comprising the steps of:
    forming a film of metallization capable of being anodized on a substrate;
    etching said film of metallization, using a first mask, to form slits only in regions for a driver circuit;
    anodizing said film of metallization to form a barrier type anodic oxide film on a surface of said film of metallization and on side surfaces of said slits;
    etching said film of metallization, using a second mask, to form interconnection patterns for the driver circuit and for an active matrix circuit; and
    anodizing only conductive interconnects for said active matrix circuit.

7. A method of fabricating a semiconductor integrated circuit comprising the steps of:

forming a film of metallization capable of being anodized on a substrate;

etching said film of metallization, using a first mask, to form slits;

anodizing said film of metallization to form a barrier type anodic oxide film on a surface of said film of metallization and on side surfaces of said slits;

etching said film of metallization, using a second mask, to form an interconnection pattern; and anodizing only parts of said interconnection pattern formed from said film of metallization, said parts of said interconnection pattern being not coated with said barrier type anodic oxide film at side surfaces thereof.

8. A method of fabricating a semiconductor integrated circuit comprising the steps of:

forming a film of metallization capable of being anodized on a substrate;

etching said film of metallization, using a first mask, to selectively form slits in regions for a driver circuit;

anodizing said film of metallization to form a barrier type anodic oxide film on a surface of said film of metallization and on side surfaces of said slits;

etching said film of metallization, using a second mask, to form an interconnection pattern for the driver circuit; and anodizing only parts of said interconnection pattern formed from said film of metallization, said parts of said interconnection pattern being not coated with said barrier type anodic oxide film at side surfaces thereof, whereby forming a monolithic active matrix circuit.

9. The method of claim 8 wherein during said step of etching said film of metallization using said second mask, an interconnection pattern for an active matrix circuit is formed at the same time as formation of said interconnection pattern for said driver circuit, and wherein during said step of anodizing only parts of said interconnection pattern, conductive interconnects of said active matrix circuit are anodized at the same time as anodization of the parts of said film of metallization which are not covered with said barrier type anodic oxide film at side surfaces thereof.

10. A method of fabricating an integrated circuit comprising:

forming a film from a material capable of being anodized;

first patterning said film into a first pattern comprising at least two parts adjacent to each other and electrically separated from each other by a distance which is sufficiently short such that said at least two parts can be connected with each other by an undesired convex surface protrusion that is produced when the film is processed;

performing an anodization within an electrolytic solution, using said film as an anode to form an anodic oxide on a side surface of at least one of said at least two parts; and second patterning said film into a desired interconnection pattern, said anodization being done in a way to prevent formation of said undesired convex surface protrusion with a length sufficient to connect said at least two part with each other.

11. The method of claim 10 wherein said material capable of being anodized is aluminum or a material consisting mainly of aluminum.

12. The method of claim 10 wherein said patterning is carried out in regions containing conductive interconnects at a high density.

13. A method of fabricating an integrated circuit comprising:

forming a film from a material capable of being anodized;

first patterning said film into a first pattern comprising at least two parts adjacent to each other and electrically separated from each other by a distance between said at least two parts which is sufficiently short such that said at least two parts can be connected with each other by said undesired convex surface protrusion that is produced when the film is processed;

performing an anodization within an electrolytic solution, using said film as an anode; and second patterning said film into a desired interconnection pattern which has at least one of gate interconnects and gate electrodes of an integrated circuit using thin-film transistors, said anodization being done in a way to prevent formation of said undesired convex surface protrusion with a length sufficient to connect said at least two parts with each other.

14. The method of claim 13 wherein said material capable of being anodized is aluminum or a material consisting mainly of aluminum.

15. The method of claim 13 wherein said patterning is carried out in regions containing conductive interconnects at a high density.

16. A method of fabricating an integrated circuit comprising:

forming a film from a material capable of being anodized;

first patterning said film into a first pattern comprising at least two parts adjacent to each other and electrically separated from each other by a distance between said at least two parts which is sufficiently short such that said at least two parts can be connected with each other by an undesired convex surface protrusion that is produced when the film is processed;

performing an anodization within an electrolytic solution, using said film as an anode;

second patterning said film into a desired interconnection pattern; and subsequently heat treating said film, wherein the undesired convex surface protrusion having a length sufficient to connect said at least two parts with each other is prevented from being generated on a surface of at least one of said at least two parts during said heat treating, by forming an anodic oxide on a side surface of at least one of said at least two parts by said anodization.

17. The method of claim 16 wherein said material capable of being anodized is aluminum or a material consisting mainly of aluminum.

18. The method of claim 16 wherein said patterning is carried out in regions containing conductive interconnects at a high density.

19. A method of fabricating an integrated circuit comprising:

forming a film from aluminum or a material consisting mainly of aluminum;

first patterning said film into a first pattern comprising at least two parts adjacent to each other and electrically separated from each other by a distance between said at least two parts which is sufficiently short such that said at least two parts can be connected with each other by said undesired hillocks and/or whiskers that are produced when the film is processed;

performing an anodization within an electrolytic solution, using said film as an anode;

second patterning said film into a desired interconnection pattern; and subsequently heat treating said film while permitting generation of hillocks and/or whiskers on surfaces not anodized, wherein at least one of hillock and a whisker having a length sufficient to connect said at least two parts with each other is prevented from being generated during said heat treating on a surface of at least one of said at least two parts by forming an anodic oxide on a side surface of at least one of said at least two parts by said anodization.

20. The method of claim 19 wherein said patterning is carried out in regions containing conductive interconnects at a high density.

21. A method as in claim 10, wherein said undesired convex surface protrusion is one of a hillock or a whisker.

22. A method as in claim 13, wherein said undesired convex surface protrusion is one of a hillock or a whisker.

23. A method as in claim 16, wherein said undesired convex surface protrusion is one of a hillock or a whisker.

* * * * *